United States Patent
Appelbaum et al.

(10) Patent No.: US 12,128,786 B2
(45) Date of Patent: Oct. 29, 2024

(54) INLINE ELECTRIC VEHICLE SUPPLY EQUIPMENT (EVSE) ELECTRIC METERING DEVICE, SYSTEM, AND METHOD

(71) Applicant: EVERCHARGE, INC., San Francisco, CA (US)

(72) Inventors: Jason Appelbaum, Oakland, CA (US); John Loren Passmore, Berkeley, CA (US)

(73) Assignee: Evercharge Inc., San Francisco, CA (US)

( * ) Notice: Subject to any disclaimer, the term of this patent is extended or adjusted under 35 U.S.C. 154(b) by 120 days.

(21) Appl. No.: 17/665,530

(22) Filed: Feb. 5, 2022

(65) Prior Publication Data
US 2022/0266712 A1 Aug. 25, 2022

Related U.S. Application Data

(60) Provisional application No. 63/153,729, filed on Feb. 25, 2021.

(51) Int. Cl.
*B60L 53/66* (2019.01)
*B60L 53/16* (2019.01)
(Continued)

(52) U.S. Cl.
CPC ............ *B60L 53/665* (2019.02); *B60L 53/16* (2019.02); *B60L 53/18* (2019.02); *G01R 22/00* (2013.01);
(Continued)

(58) Field of Classification Search
CPC ...... B60L 53/305; B60L 53/16; B60L 53/665; G01R 21/00; G01R 19/00; G01R 22/00; G01R 35/04; G01S 19/13; H02J 7/0047
See application file for complete search history.

(56) References Cited

U.S. PATENT DOCUMENTS 7,917,251 B2 * 3/2011 Kressner ............... G07C 5/008
455/3.06
9,020,771 B1 4/2015 Hardy
(Continued)

FOREIGN PATENT DOCUMENTS

CN 111722044 A 9/2020
WO 2012078921 A2 6/2012

OTHER PUBLICATIONS

ISR and Written Opinion; PCT/US22/15510.
Australia Examination report No. 1, Jun. 27, 2024.
EPO Search Report, Jun. 26, 2024.

*Primary Examiner* — Feba Pothen
(74) *Attorney, Agent, or Firm* — Renaissance IP Law Group, LLP; David A. Crowther

(57) ABSTRACT

A system for checking metering accuracy of an EVSE unit includes an EVSE unit including a cable and a charge handle. The system includes an electric vehicle including a charging port configured to be coupled to the charge handle. The electric vehicle is configured to be charged by the EVSE unit using the cable and the charge handle. In place of the electric vehicle, an electric vehicle-emulating electric load can be used. The system includes an inline electric meter device having a terminal end and a distal end. The charging port of the electric vehicle is configured to be coupled to the terminal end of the inline electric meter device. The charge handle is configured to be coupled to the distal end of the inline electric meter device. The inline electric meter device may be connected in various configurations. The inline electric meter device includes a display, a microprocessor, test and diagnostic logic, a report generator, a camera, and/or a GPS receiver.

18 Claims, 10 Drawing Sheets

(51) Int. Cl.
 *B60L 53/18* (2019.01)
 *G01R 22/00* (2006.01)
 *G01R 35/04* (2006.01)
 *G01S 19/13* (2010.01)
 *H02J 7/00* (2006.01)

(52) U.S. Cl.
 CPC .............. *G01R 35/04* (2013.01); *G01S 19/13* (2013.01); *H02J 7/0047* (2013.01)

(56) References Cited

U.S. PATENT DOCUMENTS

| | | |
|---|---|---|
| 9,758,046 B2 | 9/2017 | Harper et al. |
| 2010/0237985 A1 | 9/2010 | Landau-Holdsworth et al. |
| 2012/0022811 A1 | 1/2012 | Dickinson et al. |
| 2014/0160280 A1 | 6/2014 | Rodríguez et al. |
| 2015/0346288 A1 | 12/2015 | Hardy et al. |
| 2018/0225774 A1* | 8/2018 | Pardoen ............... G07C 5/0841 |
| 2019/0255963 A1 | 8/2019 | Goei et al. |

* cited by examiner

INLINE ELECTRIC VEHICLE SUPPLY EQUIPMENT (EVSE) ELECTRIC METERING DEVICE, SYSTEM, AND METHOD

RELATED APPLICATION DATA

This application claims the benefit of U.S. Provisional Patent Application No. 63/153,729, filed on Feb. 25, 2021, which is hereby incorporated by reference.

FIELD

This disclosure relates to electric vehicle supply equipment (EVSE), and, more particularly, to an inline EVSE electric metering device, and system for checking metering accuracy of the EVSE unit, and associated method.

BACKGROUND

The adoption of electric vehicles, plug-in hybrid electric vehicles, and the like, continues at a rapid pace. As the deployment of electric vehicles increases, the charging infrastructure must be adapted to meet demand Sometimes an EVSE unit or an electric vehicle itself may function below an expected level of performance, or may suffer from other unknown problems and malfunctions. Diagnostic tools are sparse within the arena of electric vehicle charging infrastructure. Currently tools are primarily built for a more traditional electric system that was not prepared for the paradigm shift toward electric vehicles and electric vehicle charging infrastructure. EVSE metering accuracy may be governed by regulations and standards which require the EVSE to be tested periodically for accuracy. The accuracy testing may require that the EVSE meter energy accurately and that the accuracy be checked at each specified rates of energy delivery.

Accordingly, a need remains for improved methods and systems for testing and diagnosing EVSE units, electric vehicles, and/or electric vehicle charging performance, and of measuring the energy and/or power output of EVSE units to confirm that it matches the EVSE unit's own measurements, which may be displayed on the EVSE or transmitted to users of the EVSE via other methods. Embodiments of the invention address these and other limitations in the prior art.

Figure 1:
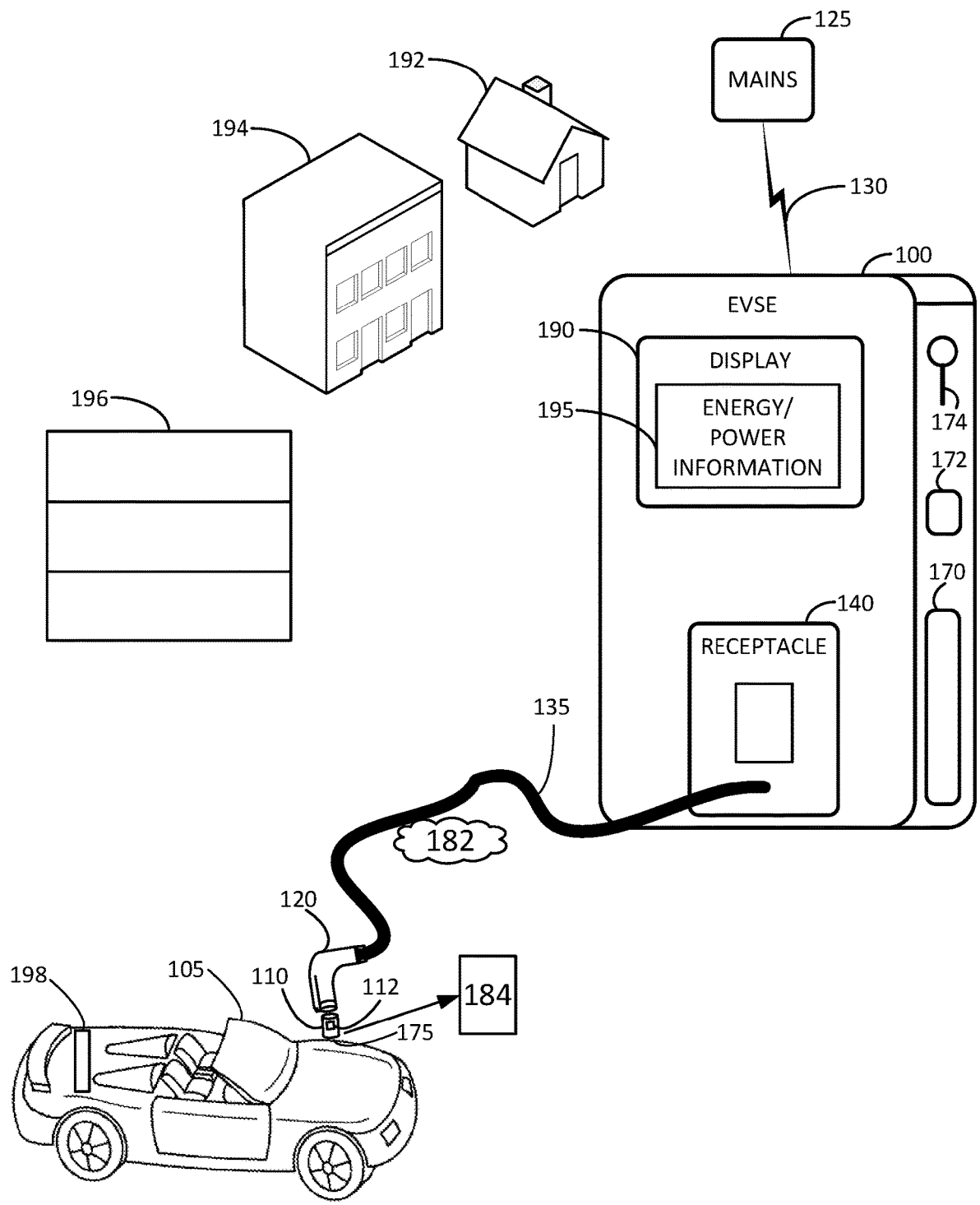
FIG. 1 illustrates an example block diagram of an EVSE unit, an electric vehicle, and an inline electric meter device in accordance with various embodiments of the present invention.

The foregoing and other features of the invention will become more readily apparent from the following detailed description, which proceeds with reference to the accompanying drawings.

DETAILED DESCRIPTION OF THE EMBODIMENTS

Reference will now be made in detail to embodiments of the inventive concept, examples of which are illustrated in the accompanying drawings. The accompanying drawings are not necessarily drawn to scale. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first electric vehicle could be termed a second electric vehicle, and, similarly, a second electric vehicle could be termed a first electric vehicle, without departing from the scope of the inventive concept.

Like numbers refer to like elements throughout. The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Reference is often made herein to "electric vehicles." It will be understood that such vehicles can include plug-in hybrid vehicles, pure electric vehicles, an electric golf cart, an electric bike, an electric scooter, an electric skateboard, a SEGWAY®, or any one of a variety of vehicles that operate or move using at least some electricity. Such vehicles can also include electric trucks, delivery vans, as well as other systems that include storage batteries including, for example, a trailer of an electric tractor-trailer vehicle, which may contain batteries to be charged even though it is not itself a complete vehicle. The term "control signal" as referred to herein can be a "pilot signal," or other suitable control signal. The term "pilot signal" as referred to herein can be a low voltage connection that is used to control a level of current draw that the electric vehicle requests or is allowed to request.

FIG. 1 illustrates an example block diagram of an EVSE unit 100, an electric vehicle 105, and an inline electric meter device 110 in accordance with various embodiments of the present invention. The EVSE unit 100 can include components and capabilities of both a Level 1 EVSE unit, a Level 2 EVSE unit, and/or a Level 3 EVSE unit. For example, the EVSE unit 100 can include a charge handle 120, which can be a Level 2 charge handle and/or a Level 3 charge handle. While reference herein is generally made to a charge handle 120, each instance of such reference can be replaced with a Level 2 charge handle and/or a Level 3 charge handle without departing from the inventive concepts disclosed herein. The charge handle 120 can conform to the J1772 standard or other suitable standard, for example. The EVSE unit 100 can be associated with a house 192, a building 194, a parking garage 196, or the like.

The EVSE unit 100 can include one or more components 170 for measuring the energy delivered by the EVSE unit 100, as well as one or more display components 190 to indicate the amount of energy and/or power 195 delivered to a user. The one or more display components 190 can be a digital display screen, for example. The EVSE unit 100 can include other communications methods, such as a wired network connection 172 and/or wireless network connection 174, to indicate or otherwise communicate the amount of energy and/or power delivered to the electric vehicle 105. The information from the measurements by the EVSE unit 100 can be used to determine the cost of energy delivered by the EVSE unit 100 to the electric vehicle 105.

The EVSE unit 100 can be coupled to and/or powered by mains 125 via power line 130. The charge handle 120 can be coupled to the EVSE unit 100 via a cable 135. For example, the cable 135 can be coupled to the power line 130 when in a charging state. A receptacle 140 can receive the charge handle 120 when not in use.

The charge handle 120 can be connected to the electric vehicle 105 at a charging port 175 of the electric vehicle 105. However, in some embodiments, the inline electric meter device 110 can be located between the charging port 175 and the charge handle 120. In other words, the inline electric meter device 110 can include a mechanical shape on a terminal end thereof that is substantially the same as or similar to a terminal end of the charge handle 120, such that the inline electric meter device 110 may be coupled to the charging port 175 of the electric vehicle 105. The inline electric meter device 110 can be directly and physically coupled to the charging port 175 of the electric vehicle 105, for example. The charge handle 120 may be directly and physically coupled to a distal end of the inline electric apparatus 110. In other words, the distal end of the inline electric meter device 110 can have a mechanical shape that is substantially the same as or similar to the charging port 175 of the electric vehicle 105. In this manner, the electricity flowing from the EVSE unit 100 to the electric vehicle 105 can be measured, monitored, and/or diagnosed by the inline electric meter device 110.

The inline electric meter device 110 can measure an amount of power delivered from the EVSE unit 100 to the electric vehicle 105. Alternatively or in addition, the inline electric meter device 110 can measure an amount of energy transferred between the EVSE unit 100 and the electric vehicle 105 during a charging period. The inline electric meter device 110 can display the amount of power and/or energy transferred between the EVSE unit 100 and the electric vehicle during the charging period. For example, the inline electric meter device 110 can include a display device 112, which can display such information. The display device 112 can include a digital display, for example. The inline electric meter device 110 can display power information such as an amount of power being transferred between the EVSE unit 100 and the electric vehicle 105. For example, the inline electric meter device 110 can display an instantaneous power associated with the current and voltage associated with the connection between the EVSE unit 100 and the electric vehicle 105. Some or all of such information can be displayed on the display device 112 of the inline electric meter device 110.

The inline electric meter device 110 can be an adapter that can be attached between the charge handle 120 and the electric vehicle 105. The display 112 can be operationally coupled with the inline electric meter device 110. In some embodiments, the inline electric meter device 110 can include a substantially cylindrical inline housing with a male connector on one end and a female connector on the other, so that the inline electric meter device 110 can be inserted in-between the existing charge handle 120 of the EVSE unit 100 and the electric vehicle 105.

The inline electric meter device 110 can perform testing by controlling and/or manipulating elements of the electrical connection between the EVSE unit 100 and the electric vehicle 105. For example, the inline electric meter device 110 can control and/or manipulate a pilot signal 182 generated by the EVSE unit 100. The inline electric meter device 110 can adjust the pilot signal 182 to reduce the apparent amount of current available to the electric vehicle 105 for testing purposes or otherwise. Accordingly, the inline electric meter device 110 can modify conditions of the charging process of the electric vehicle 105, and take measurements under the modified conditions. The inline electric meter device 110 can include a storage device such as a volatile or non-volatile memory to record elements of the measurements in order to implement testing procedures, as further described below. Furthermore, the inline electric meter device 110 can include a self-powered EVSE diagnostic tool, for testing and diagnosing an operation of the EVSE unit 100 and/or the electric vehicle 105, as also further described below.

Accordingly, the inline electric meter device 110 can be used to measure the energy output of the EVSE unit 100 to either confirm or refute whether the actual energy output matches the EVSE unit's own measurement of energy, which may be displayed on the EVSE unit 100 or transmitted to users of the EVSE unit 100 via other methods. The inline electric meter device 110 can provide input to the EVSE unit 100 so that any measurement error can be corrected. In other words, the EVSE unit 100 can be calibrated, either manually or automatically, based on the results determined by the inline electric meter device 110. In other words, the inline electric meter device 110 can calibrate and/or check the calibration of the EVSE unit 100 in the field. The inline electric meter device 110 can be used to determine one or more errors associated with metering of energy by the EVSE unit 100. The inline electric meter device 110 can provide an accurate reference measurement to which the EVSE 100's measurement can be corrected. Thus, stricter compliance with government regulations regarding the sale of energy to electric vehicle drivers by companies associated with the EVSE units 100 can be achieved. The EVSE unit 100 itself can have an internal energy meter, and a way of displaying or communicating (e.g., email, printed receipt, etc.) the energy and/or associated cost for the charging session.

Embodiments of the inventive concept disclosed herein can be used to compare the value reported by the EVSE unit 100 itself to the actual value measured by the inline electric meter device 110, and can be used to record the EVSE unit 100's value (e.g., using a keyboard entry, camera, network, and/or other methods). The inline electric meter device 110 can compare the recorded values, and generate one or more reports 184 about the difference between them (e.g., percent error, etc.). The one or more reports 184 may be stored and/or transmitted. For example, the inline electric meter device 110 may generate, store, and/or transmit the one or more repots 184. Alternatively or in addition, the electric vehicle 105 and/or the EVSE unit 100 may receive the one or more reports 184 from the inline electric meter device 110, and may themselves store and/or transmit the one or more reports 184.

In some embodiments, electricity can flow from the electric vehicle 105 to the EVSE unit 100. For example, the electricity can flow from the electric vehicle 105 back into the grid via the mains 125. In some embodiments, the electricity can flow from the electric vehicle 105 into the house 192, the building 194, the parking garage 196, or the like. For example, energy can flow from a battery 198 of the electric vehicle 105 into a battery associated with the house 192, the building 194, the parking garage 196, or the like. By way of another example, the energy can flow directly from the battery 198 of the electric vehicle 105 to power appliances, lights, or other machinery in the house 192, the building 194, the parking garage 196, or the like. Put differently, the battery 198 within the electric vehicle 105 can be used to provide power back to the power grid, to an individual house (e.g., 192), a larger building (e.g., 194, 196), or the like. The inline electric meter device 110 can meter the vehicle-to-grid and/or the vehicle-to-building energy. The inline electric meter device 110 can be used in cases where energy is flowing from the battery 198 of the electric vehicle 105 back through the EVSE unit 100 or other suitable device. Such a vehicle-to-grid or vehicle-to-building arrangement can be used to provide emergency power during blackouts when grid power is unavailable, and/or to provide power from the battery 198 of the electric vehicle 105 when grid power is expensive or limited. Similar to the case of confirming measurement accuracy of the EVSE unit 100, the inline electric meter device 110 can be used to confirm the accuracy of utility company metering equipment, vehicle metering equipment, or the like, when the energy is flowing from the electric vehicle 105 itself.

Figure 2:
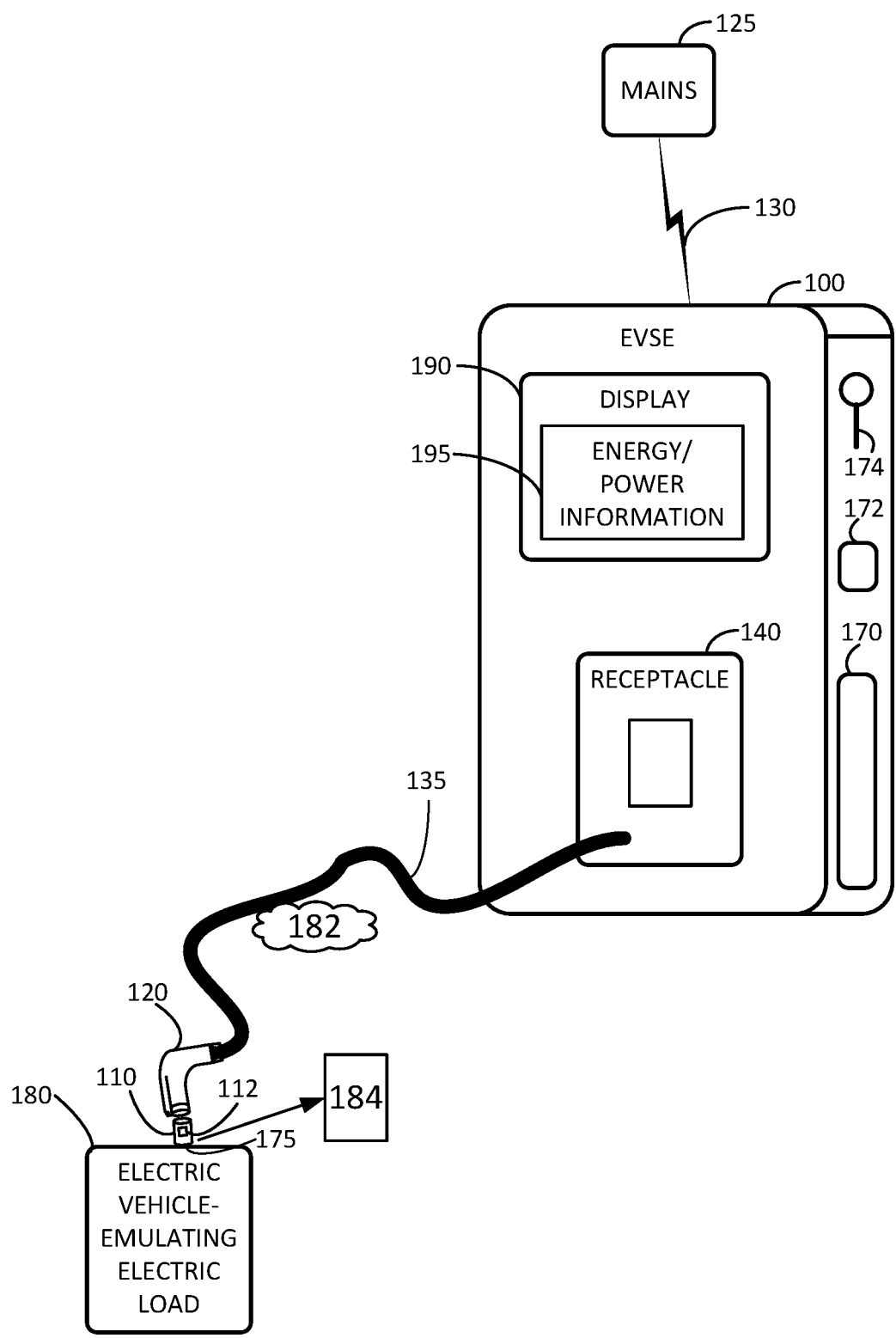
FIG. 2 illustrates an example block diagram of the EVSE unit, an electric vehicle-emulating electric load, and the inline electric meter device in accordance with various embodiments of the present invention.

FIG. 2 illustrates an example block diagram of the EVSE unit 100, an electric vehicle-emulating electric load 180, and the inline electric meter device 110 in accordance with various embodiments of the present invention. Some of the components and elements are the same as what are shown in FIG. 1, and a detailed description is not necessarily repeated. The notable difference in FIG. 2 is that the electric vehicle 105 is replaced by the electric vehicle-emulating electric load 180. In some situations, it may be impractical or difficult to have an electric vehicle physically present and available during the testing of the EVSE unit 100. The inline electric meter device 110 can be inserted in-between the existing charge handle 120 of the EVSE unit 100 and the electric vehicle-emulating electric load 180.

The inline electric meter device 110 can measure the energy used by the electric vehicle-emulating electric load 180 in order to confirm or refute the accuracy of the EVSE 100's own metering unit without the use of an electric vehicle, and/or to provide input to the EVSE unit 100 so that any measurement error can be corrected. In other words, the EVSE unit 100 can be calibrated, either manually or automatically, based on the results determined by the inline electric meter device 110. The inline electric meter device 110 can be used to determine one or more errors associated with metering of energy by the EVSE unit 100. The inline electric meter device 110 can provide an accurate reference measurement to which the EVSE 100's measurement can be corrected. In place of the electric vehicle 105 itself, the electric vehicle-emulating electric load 180 can be used, which can emulate a typical electric load of the electric vehicle 105. The inline electric meter device 110 can be physically coupled directly to the electric vehicle-emulating electric load 180, and the charge handle 120 can be physically coupled directly to the inline electric meter device 110, in a manner similar to or the same as if an electric vehicle 105 were present. The electric vehicle-emulating electric load 180 can include a port to receive a Level 2 and/or a Level 3 charge handle. The electric vehicle-emulating electric load 180 can receive the inline electric meter device 110 in place of the Level 2 and/or a Level 3 charge handle.

Figure 3:
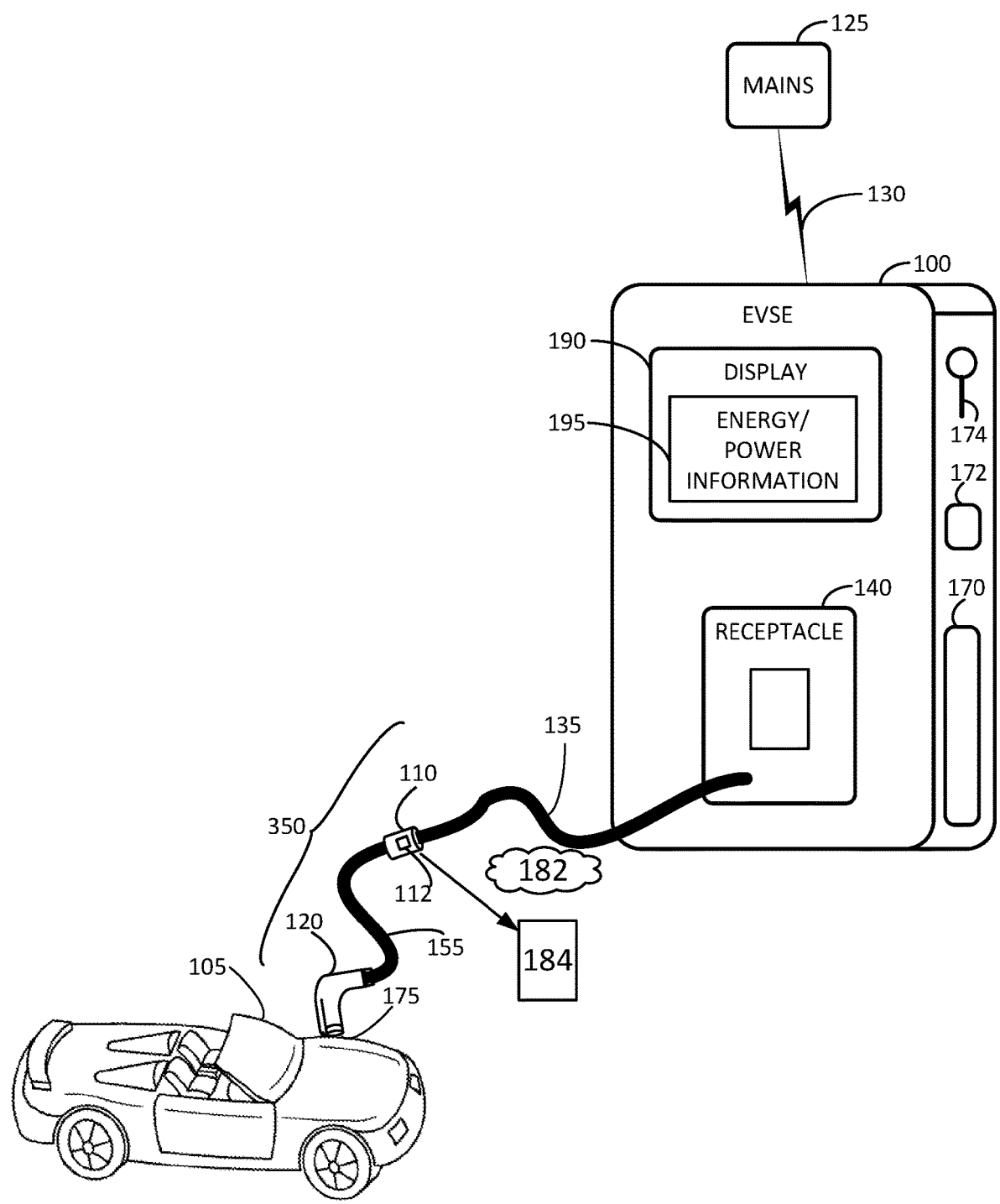
FIG. 3 illustrates another example block diagram of an EVSE unit, an electric vehicle, and an inline electric meter device in accordance with various embodiments of the present invention.

FIG. 3 illustrates another example block diagram of an EVSE unit 100, an electric vehicle 105, and an inline electric meter device 110 in accordance with various embodiments of the present invention. Some of the components and elements are the same as what are shown in FIG. 1, and a detailed description is not necessarily repeated. An inline electric apparatus 350 can include the inline electric meter device 110, a cable 155, and/or the charge handle 120. The inline electric apparatus 350 can be used to measure, store, and/or control one or more aspects related to the charging of the electric vehicle 105, as described in detail herein. The notable difference in FIG. 3 is that the inline electric meter device 110 is directed attached to the cable (e.g., 135, 155), and a single charge handle 120 is attached to the charging port 175 of the electric vehicle 105. In other words, the inline electric meter device 110 may be located directly between the EVSE unit 100 and the electric vehicle 105. More specifically, a first portion 135 of a charge cable can connect between the EVSE unit 100 and the inline electric meter device 110, and a second portion 155 of the charge cable can connect between the inline electric meter device 110 and the electric vehicle 105. In some embodiments, the inline electric meter device 110 is embedded either entirely or partially within (not shown) the cable. The inline electric meter device 110 of FIG. 3 can function in a similar or same fashion as described above, and therefore, a detailed description of such functions is not repeated.

Figure 4:
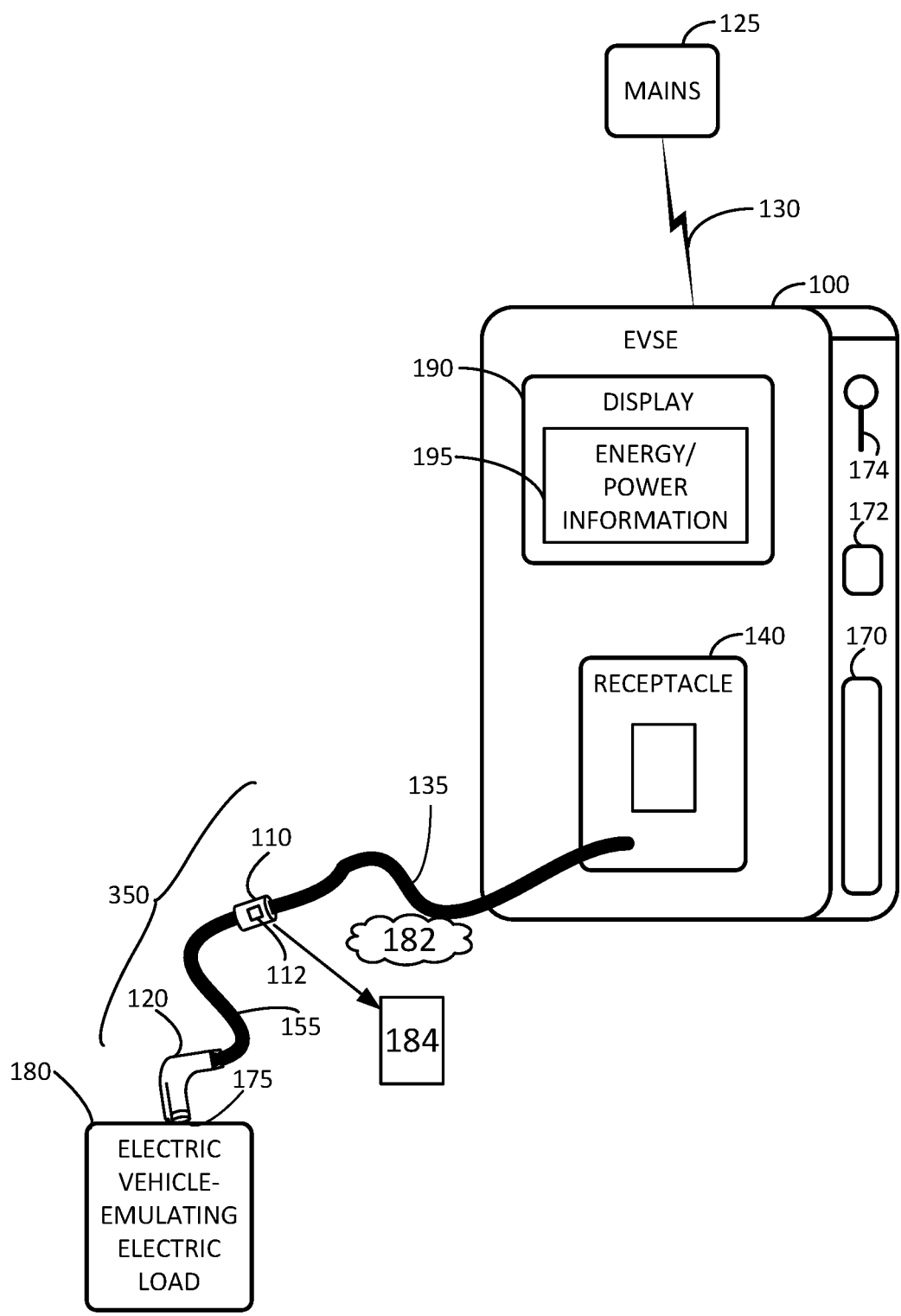
FIG. 4 illustrates another example block diagram of the EVSE unit, an electric vehicle-emulating electric load, and the inline electric meter device in accordance with various embodiments of the present invention.

FIG. 4 illustrates another example block diagram of the EVSE unit 100, an electric vehicle-emulating electric load 180, and the inline electric meter device 110 in accordance with various embodiments of the present invention. Some of the components and elements are the same as what are shown in FIG. 2, and a detailed description is not necessarily repeated. The inline electric meter device 110 can measure the energy used by the electric vehicle-emulating electric load 180 in order to confirm or refute the accuracy of the EVSE 100's own metering unit without the use of an electric vehicle. In other words, in place of the electric vehicle 105 itself, the electric vehicle-emulating electric load 180 can be used, which can emulate a typical electric load of the electric vehicle 105. The charge handle 120 can be physically coupled directly to the electric vehicle-emulating electric load 180, and the cable (e.g., 135, 155), can be physically coupled directly to the inline electric meter device 110, in a manner similar to or the same as if an electric vehicle 105 were present. The electric vehicle-emulating electric load 180 can include a port to receive a Level 2 and/or a Level 3 charge handle. The electric vehicle-emulating electric load 180 can receive the Level 2 and/or a Level 3 charge handle.

Figure 5:
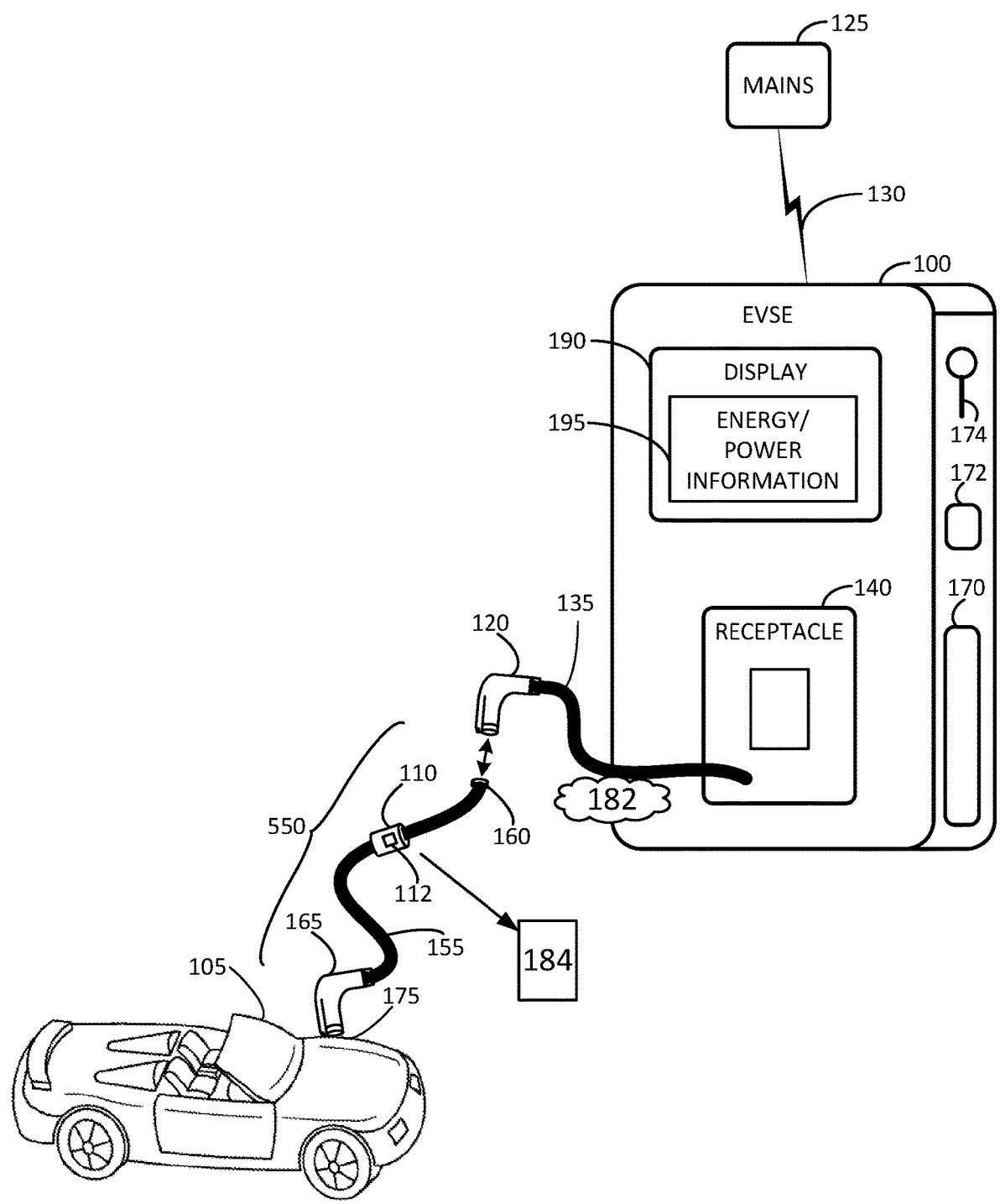
FIG. 5 illustrates yet another example block diagram of an EVSE unit, an electric vehicle, and an inline electric meter device in accordance with various embodiments of the present invention.

FIG. 5 illustrates yet another example block diagram of an EVSE unit 100, an electric vehicle 105, and an inline electric meter device 110 in accordance with various embodiments of the present invention. Some of the components and elements are the same as what are shown in FIG. 1, and a detailed description is not necessarily repeated. An inline electric apparatus 550 can include the inline electric meter device 110, the cable 155, a charge handle 165, and/or a coupling means 160. The coupling means 160 can connect the inline electric meter device 110 to the charge handle 120 of the EVSE unit 100. The inline electric apparatus 550 can be used to measure, store, and/or control one or more aspects related to the charging of the electric vehicle 105, as described in detail herein. The notable difference in FIG. 5 is that the inline electric meter device 110 is directed attached to the cable (e.g., 155), with the charge handle 165 being attached to the charging port 175 of the electric vehicle 105. The coupling means 160 connects the cable (e.g., 155) with the charge handle 120, which is connected to the EVSE unit 100 via the cable 135. The inline electric meter device 110 may be coupled to the charge handle 120 via the coupling means 160, and a second charge handle 165 can be attached to the charging port 175 of the electric vehicle 105. The cable 155 and the charge handle 165 can connect the inline electric meter device 110 to the electric vehicle 105. Put differently, the inline electric meter device 110 may be located directly between the charge handle 120 of the EVSE unit 100 and the charge handle 165 that is connected to the electric vehicle 105. In some embodiments, the inline electric meter device 110 is at least partially embedded within (not shown) the cable. The inline electric meter device 110 of FIG. 5 can function in a similar or same fashion as described above, and therefore, a detailed description of such functions is not repeated.

Figure 6:
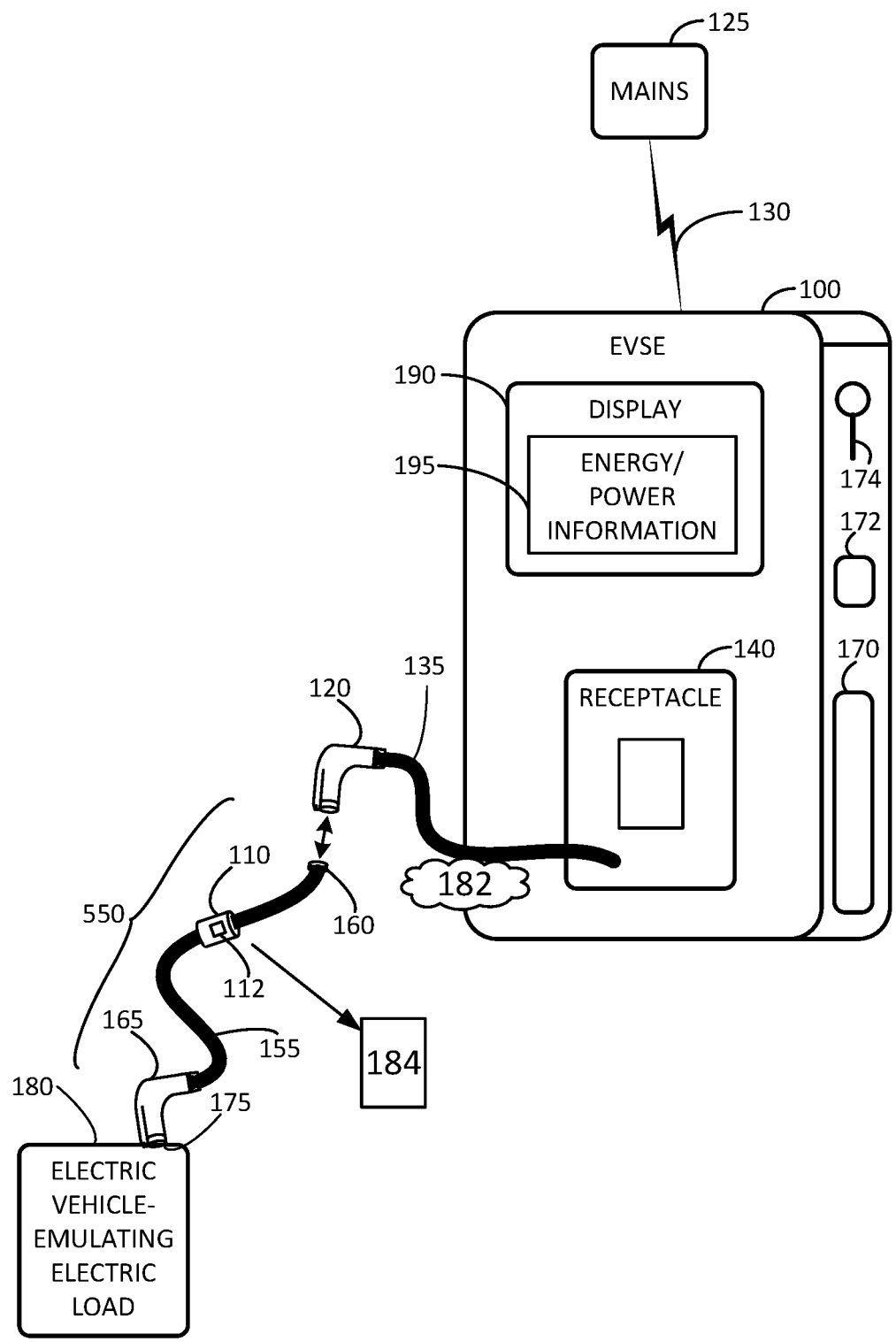
FIG. 6 illustrates yet another example block diagram of the EVSE unit, an electric vehicle-emulating electric load, and the inline electric meter device in accordance with various embodiments of the present invention.

FIG. 6 illustrates yet another example block diagram of the EVSE unit 100, an electric vehicle-emulating electric load 180, and the inline electric meter device 110 in accordance with various embodiments of the present invention. Some of the components and elements are the same as what are shown in FIG. 2, and a detailed description is not necessarily repeated. The inline electric meter device 110 can measure the energy used by the electric vehicle-emulating electric load 180 in order to confirm or refute the accuracy of the EVSE 100's own metering unit without the use of an electric vehicle. In other words, in place of the electric vehicle 105 itself, the electric vehicle-emulating electric load 180 can be used, which can emulate a typical electric load of the electric vehicle 105. The charge handle 165 can be physically coupled directly to the electric vehicle-emulating electric load 180, and the cable (e.g., 155), can be physically coupled directly to the inline electric meter device 110, in a manner similar to or the same as if an electric vehicle 105 were present. The electric vehicle-emulating electric load 180 can include a port to receive a Level 2 and/or a Level 3 charge handle. The electric vehicle-emulating electric load 180 can receive the Level 2 and/or a Level 3 charge handle.

Figure 7:
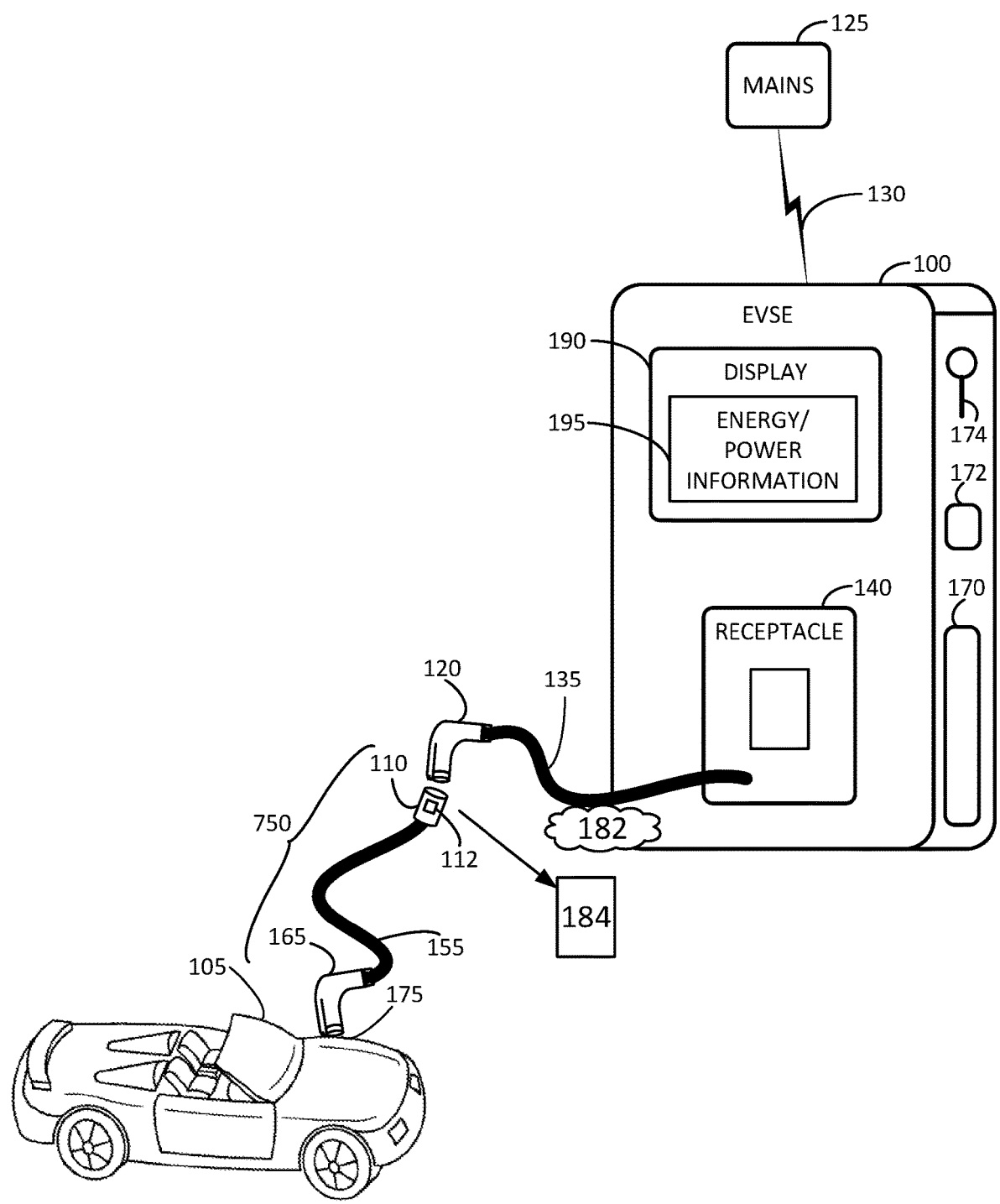
FIG. 7 illustrates still another example block diagram of an EVSE unit, an electric vehicle, and an inline electric meter device in accordance with various embodiments of the present invention.

FIG. 7 illustrates still another example block diagram of an EVSE unit 100, an electric vehicle 105, and an inline electric meter device 110 in accordance with various embodiments of the present invention. Some of the components and elements are the same as what are shown in FIG. 1, and a detailed description is not necessarily repeated. An inline electric apparatus 750 can include the inline electric meter device 110, the cable 155, and/or a charge handle 165. The notable difference in FIG. 7 is that the inline electric meter device 110 can be connected directly to the charge handle 120 of the EVSE unit 100. The inline electric apparatus 750 can be used to measure, store, and/or control one or more aspects related to the charging of the electric vehicle 105, as described in detail herein. The inline electric meter device 110 may be located directly between the charge handle 120 of the EVSE unit 100 and the charge handle 165 that is connected to the electric vehicle 105. Put differently, the inline electric meter device 110 may directly receive the charge handle 120, and a second charge handle 165 can be attached to the charging port 175 of the electric vehicle 105. In other words, the inline electric meter device 110 can include a port into which the charge handle 120 can be plugged. The cable 135 can connect the charge handle 120 to the EVSE unit 100.

The cable 155 and the charge handle 165 can connect the inline electric meter device 110 to the electric vehicle 105. In some embodiments, the inline electric meter device 110 is embedded within (not shown) the cable. The inline electric meter device 110 of FIG. 7 can function in a similar or same fashion as described above, and therefore, a detailed description of such functions is not repeated.

Figure 8:
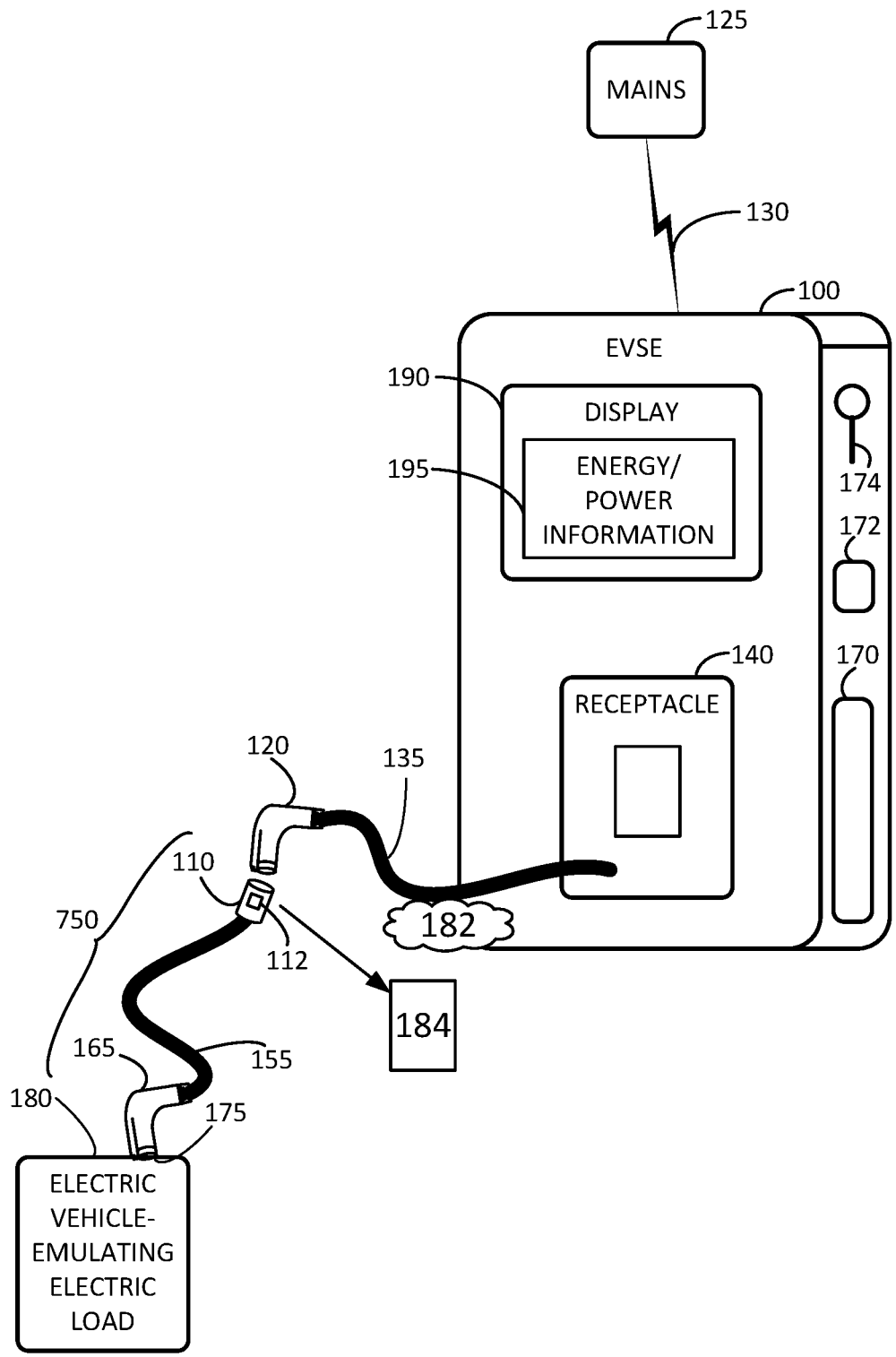
FIG. 8 illustrates still another example block diagram of the EVSE unit, an electric vehicle-emulating electric load, and the inline electric meter device in accordance with various embodiments of the present invention.

FIG. 8 illustrates still another example block diagram of the EVSE unit 100, an electric vehicle-emulating electric load 180, and the inline electric meter device 110 in accordance with various embodiments of the present invention. Some of the components and elements are the same as what are shown in FIG. 2, and a detailed description is not necessarily repeated. The inline electric meter device 110 can measure the energy used by the electric vehicle-emulating electric load 180 in order to confirm or refute the accuracy of the EVSE 100's own metering unit without the use of an electric vehicle. In other words, in place of the electric vehicle 105 itself, the electric vehicle-emulating electric load 180 can be used, which can emulate a typical electric load of the electric vehicle 105. The charge handle 165 can be physically coupled directly to the electric vehicle-emulating electric load 180, and the cable (e.g., 155), can be physically coupled directly to the inline electric meter device 110, in a manner similar to or the same as if an electric vehicle 105 were present. The electric vehicle-emulating electric load 180 can include a port to receive a Level 2 and/or a Level 3 charge handle. The electric vehicle-emulating electric load 180 can receive the Level 2 and/or a Level 3 charge handle.

Figure 9:
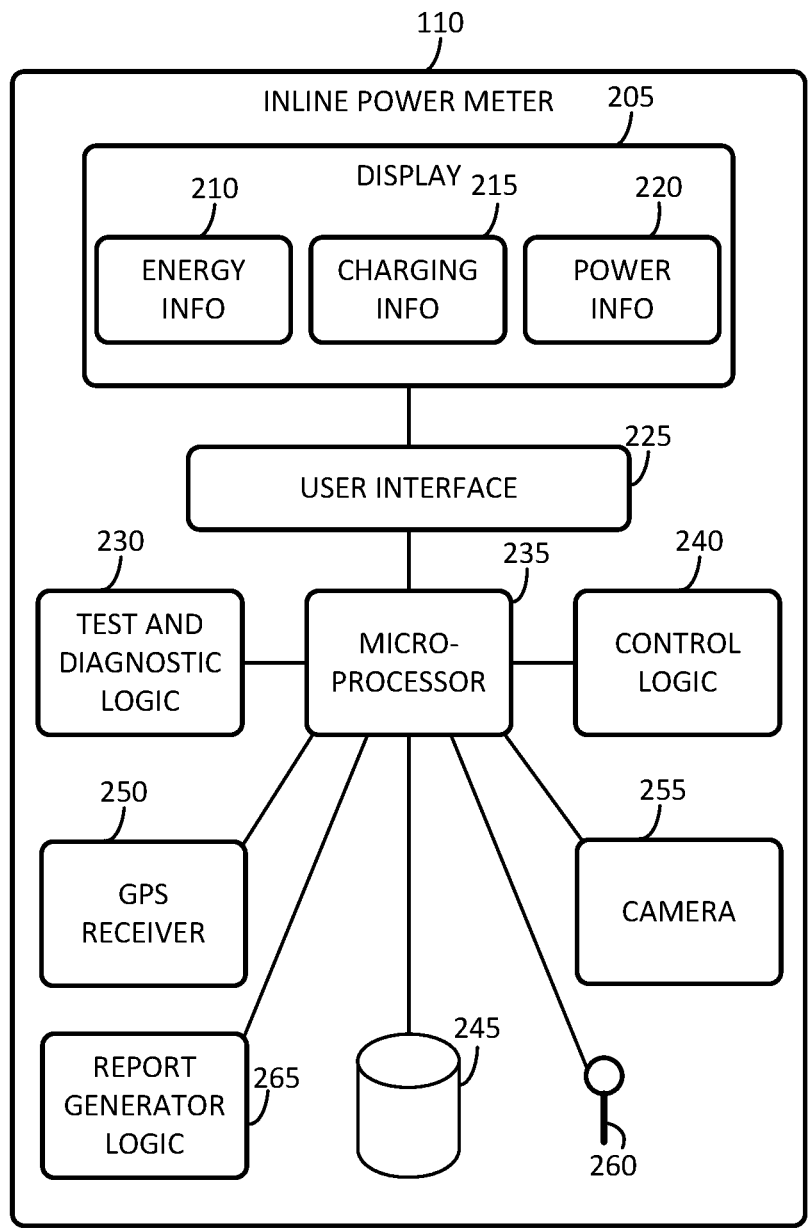
FIG. 9 illustrates an example block diagram of the inline electric meter device of FIGS. 1 through 8 in accordance with various embodiments of the present invention.

FIG. 9 illustrates an example block diagram of the inline electric meter device of FIGS. 1 through 8 in accordance with various embodiments of the present invention. The inline electric meter device 110 can include a display 205. The display 205 can be a liquid crystal display (LCD), a light emitting diode (LED), or the like. When attached to the EVSE unit 100 and the electric vehicle 105, the inline electric meter device 110 can display on the display 205 energy information 210 such as the amount of energy transferred between the EVSE unit 100 and the electric vehicle during the charging period. The display 205 can display other charging information 215. The display 205 can display power information 220 such as an amount of power being transferred between the EVSE unit 100 and the electric vehicle 105. For example, the display 205 can display an instantaneous power associated with the current and voltage associated with the connection between the EVSE unit 100 and the electric vehicle 105. By way of another example, the display 205 can display the one or more reports 184, discussed above.

The inline electric meter device 110 can include a user interface 225. The user interface 225 can receive one or more inputs from a user, and cause the inline electric meter device 110 to perform one or more operations. The one or more operations can include, for example, powering on, powering off, taking a measurement, storing a measurement, and the like. The inline electric meter device 110 can include a microprocessor 235. The microprocessor 235 can control a storage device 245. The storage device 245 can be a volatile storage device such as random access memory (RAM) and/or a non-volatile storage device such as flash memory or a solid state drive (SSD). The microprocessor 235 can execute test and diagnostic logic 230. In addition, the microprocessor 235 can execute control logic 240. Accordingly, the microprocessor 235 can control the taking of energy and power measurements, and/or can perform diagnostics on a charging process. In addition, the microprocessor 235 can perform test and diagnostics on the EVSE unit 100 and/or the electric vehicle 105.

The inline electric meter device 110 can include a global positioning system (GPS) receiver 250, which can allow the recording of the location, date, and/or time associated with measurements performed by the inline electric meter device 110. The inline electric meter device 110 can include a camera 255, which can capture one or more images documenting relevant information about the EVSE unit 100 being tested, measured, calibrated, and/or checked. Alternatively or in addition, the camera 255 can capture one or more images documenting relevant information about the electric vehicle 105. For example, the documentation can include a serial number, version information, and/or other identifying information. The inline electric meter device 110 can include one or more antennas 260, which can transmit or receive information associated with the EVSE unit 100, an electric vehicle (e.g., 105), an electric vehicle emulating electric load (e.g., 180), or the like. The inline electric meter device 110 can include report generator logic 265. The report generator logic 265 can generate one or more reports 184, for example. The one or more antennas 260 of the inline electric meter device 110 can transmit the one or more reports 184 or other information associated with the EVSE unit 100 or the electric vehicle 105.

Figure 10:
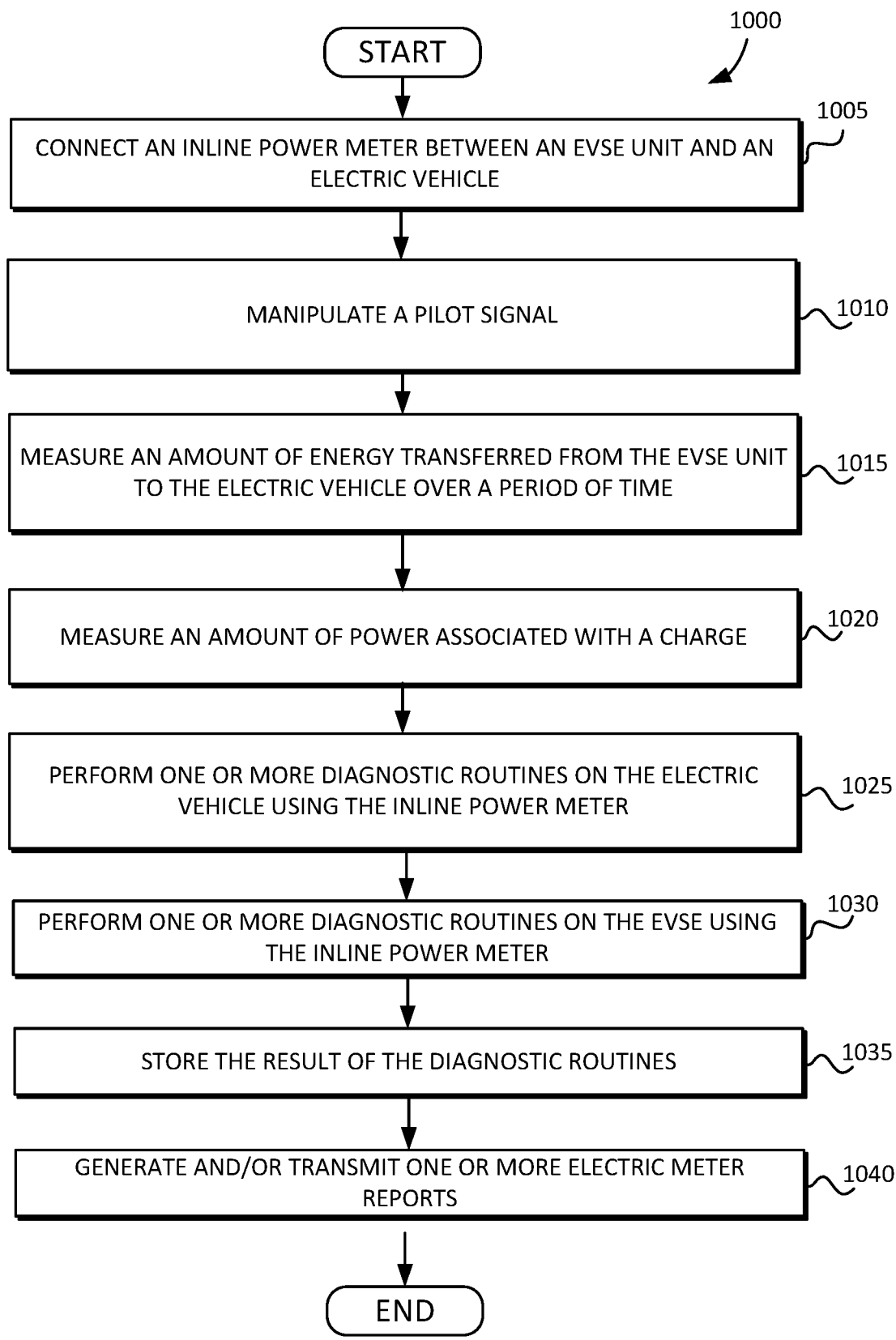
FIG. 10 shows a flow diagram illustrating a technique for using an electric vehicle inline electric meter device in accordance with embodiments of the present invention.

FIG. 10 shows a flow diagram illustrating a technique for using an electric vehicle inline electric meter device in accordance with embodiments of the present invention. At 1005, an inline electric meter device (e.g., 110) can be connected between an EVSE unit (e.g., 100) and an electric vehicle (e.g., 105). At 1010, the inline electric meter device can manipulate a pilot signal (e.g., 182) between the EVSE unit and the electric vehicle. At 1015, an amount of energy transferred from the EVSE unit to the electric vehicle can be measured. At 1020, an amount of power associated with a charge can be measured. At 1025, one or more diagnostic routines can be performed on the electric vehicle using the inline electric meter device. At 1030, one or more diagnostic routines can be performed on the EVSE unit using the inline electric meter device. At 1035, the results of the various diagnostic routines can be stored on a storage device (e.g., 245) of the inline electric meter device. At 1040, the inline electric meter device can generate and/or transmit one or more electric meter reports (e.g., 184). The one or more electric meter reports can be based on the measurements taken and/or the results of the various diagnostic routines.

Some embodiments include a system for checking metering accuracy of an EVSE unit. The system can include an EVSE unit. The EVSE unit can include a cable and a charge handle. The system can include an electric vehicle including a charging port configured to be coupled to the charge handle, wherein the electric vehicle is configured to be charged by the EVSE unit using the cable and the charge handle. The system can include an inline electric meter device including a terminal end and a distal end, wherein the charging port of the electric vehicle is configured to be coupled to the terminal end of the inline electric meter device, and wherein the charge handle is configured to be coupled to the distal end of the inline electric meter device.

In some embodiments, the inline electric meter device is configured to check metering accuracy of the EVSE unit. The inline electric meter device can include a display that is configured to display information regarding metering accuracy of the EVSE unit. The terminal end of the inline electric meter device can include a mechanical shape that is substantially the same as a terminal end of at least one of a Level 1 charge handle or a Level 2 charge handle. The distal end of the inline electric meter device can include a mechanical shape that is substantially the same as the charging port of the electric vehicle. The inline electric meter device can be configured to measure instantaneous power delivered from the EVSE unit to the electric vehicle. The inline electric meter device can be configured to measure an amount of energy delivered from the EVSE unit to the electric vehicle. The inline electric meter device can be configured to generate one or more reports regarding metering accuracy of the EVSE unit.

In some embodiments, the inline electric meter device can include a test and diagnostic logic section that is configured to perform at least one of a test or a diagnostic of at least one of the EVSE unit or the electric vehicle. The inline electric meter device can include a storage device configured to store one or more measurements associated with at least one of the EVSE unit or the electric vehicle. The inline electric meter device can include a GPS receiver. The inline electric meter device can be configured to record at least one of a location, a date, or a time associated with one or more measurements. The inline electric meter device can include a camera configured to capture one or more images documenting information about at least one of the EVSE unit or the electric vehicle. The inline electric meter device cab include a report generator logic section configured to generate one or more reports regarding metering accuracy of the EVSE unit. The inline electric meter device can include one or more antennas that are configured to transmit the one or more reports.

In some embodiments, the inline electric meter device is configured to manipulate a pilot signal associated with at least one of the EVSE unit or the electric vehicle, thereby causing one or more modified conditions of a charging process of the electric vehicle. The inline electric meter device can be configured to take one or more measurements under the one or more modified conditions of the charging process.

The system can include an electric vehicle-emulating electric load having a charging port configured to be coupled to the charge handle. The electric vehicle-emulating electric load can be configured to be charged by the EVSE unit using the cable and the charge handle. The system can include an inline electric meter device including a terminal end and a distal end. The charging port of the electric vehicle-emulating electric load can be configured to be coupled to the terminal end of the inline electric meter device, and wherein the charge handle is configured to be coupled to the distal end of the inline electric meter device. The inline electric meter device can be configured to check metering accuracy of the EVSE unit. The inline electric meter device can be configured to manipulate a pilot signal associated with at least one of the EVSE unit or the electric vehicle-emulating electric load, thereby causing one or more modified conditions of a charging process of the electric vehicle-emulating electric load. The inline electric meter device can be configured to take one or more measurements under the one or more modified conditions of the charging process.

The following discussion is intended to provide a brief, general description of a suitable machine or machines in which certain aspects of the invention can be implemented. Typically, the machine or machines include a system bus to which is attached processors, memory, e.g., random access memory (RAM), read-only memory (ROM), or other state preserving medium, storage devices and units, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the invention can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the invention with reference to illustrated embodiments, it will be recognized that the illustrated embodiments can be modified in arrangement and detail without departing from such principles, and can be combined in any desired manner And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms can reference the same or different embodiments that are combinable into other embodiments.

Embodiments of the invention may include a non-transitory machine-readable medium comprising instructions executable by one or more processors, the instructions comprising instructions to perform the elements of the inventive concepts as described herein.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. A system for checking metering accuracy of an electric vehicle supply equipment (EVSE) unit, the system comprising:
    an EVSE unit including a cable and a charge handle;
    an electric vehicle including a charging port configured to be coupled to the charge handle, wherein the electric vehicle is configured to be charged by the EVSE unit using the cable and the charge handle; and
    an inline electric meter device including a terminal end and a distal end, wherein the charging port of the electric vehicle is configured to be coupled to the terminal end of the inline electric meter device, and wherein the charge handle is configured to be coupled to the distal end of the inline electric meter device,
    wherein:
    the terminal end of the inline electric meter device includes a mechanical shape that is substantially the same as a terminal end of at least one of a Level 1 charge handle or a Level 2 charge handle;
    the distal end of the inline electric meter device includes a mechanical shape that is substantially the same as the charging port of the electric vehicle;
    the distal end of the inline electric meter device is configured to be directly coupled to the charging port of the electric vehicle; and
    the terminal end of the inline electric meter device is configured to be directly coupled to the terminal end of the least one of the Level 1 charge handle or the Level 2 charge handle.

2. The system of claim 1, wherein the inline electric meter device is configured to check metering accuracy of the EVSE unit.

3. The system of claim 1, wherein the inline electric meter device includes a display that is configured to display information regarding metering accuracy of the EVSE unit.

4. The system of claim 1, wherein:
the inline electric meter device is configured to measure instantaneous power delivered from the EVSE unit to the electric vehicle;
the inline electric meter device is configured to be directly coupled without cables between the charging port of the electric vehicle and the terminal end of the least one of the Level 1 charge handle or the Level 2 charge handle; and
the at least one of the Level 1 charge handle or the Level 2 charge handle is configured to be plugged into the terminal end of the inline electric meter device.

5. The system of claim 1, wherein the inline electric meter device is configured to measure an amount of energy delivered from the EVSE unit to the electric vehicle.

6. The system of claim 1, wherein the inline electric meter device is configured to generate one or more reports regarding metering accuracy of the EVSE unit.

7. The system of claim 1, wherein the inline electric meter device includes a test and diagnostic logic section that is configured to perform at least one of a test or a diagnostic of at least one of the EVSE unit or the electric vehicle.

8. The system of claim 1, wherein the inline electric meter device includes a storage device configured to store one or more measurements associated with at least one of the EVSE unit or the electric vehicle.

9. The system of claim 1, wherein the inline electric meter device includes a global positioning system (GPS) receiver, and wherein the inline electric meter device is configured to record at least one of a location, a date, or a time associated with one or more measurements.

10. The system of claim 1, wherein the inline electric meter device includes a camera configured to capture one or more images documenting information about at least one of the EVSE unit 100 or the electric vehicle.

11. The system of claim 1, wherein the inline electric meter device includes a report generator logic section configured to generate one or more reports regarding metering accuracy of the EVSE unit.

12. The system of claim 11, wherein the inline electric meter device includes one or more antennas that are configured to transmit the one or more reports.

13. The system of claim 1, wherein the inline electric meter device is configured to manipulate a pilot signal associated with at least one of the EVSE unit or the electric vehicle, thereby causing one or more modified conditions of a charging process of the electric vehicle.

14. The system of claim 13, wherein the inline electric meter device is configured to take one or more measurements under the one or more modified conditions of the charging process.

15. A system for checking metering accuracy of an electric vehicle supply equipment (EVSE) unit, the system comprising:
an EVSE unit including a cable and a charge handle;
an electric vehicle-emulating electric load including a charging port configured to be coupled to the charge handle, wherein the electric vehicle-emulating electric load is configured to be charged by the EVSE unit using the cable and the charge handle; and
an inline electric meter device including a terminal end and a distal end, wherein the charging port of the electric vehicle-emulating electric load is configured to be coupled to the terminal end of the inline electric meter device, and wherein the charge handle is configured to be coupled to the distal end of the inline electric meter device,
wherein:
the terminal end of the inline electric meter device includes a mechanical shape that is substantially the same as a terminal end of at least one of a Level 1 charge handle or a Level 2 charge handle;
the distal end of the inline electric meter device includes a mechanical shape that is substantially the same as the charging port of the electric vehicle-emulating electric load;
the distal end of the inline electric meter device is configured to be directly coupled to the charging port of the electric vehicle-emulating electric load;
the terminal end of the inline electric meter device is configured to be directly coupled to the terminal end of the least one of the Level 1 charge handle or the Level 2 charge handle;
the inline electric meter device is configured to measure instantaneous power delivered from the EVSE unit to the electric vehicle-emulating electric load;
the inline electric meter device is configured to be directly coupled without cables between the electric vehicle-emulating electric load and the terminal end of the least one of the Level 1 charge handle or the Level 2 charge handle; and
the at least one of the Level 1 charge handle or the Level 2 charge handle is configured to be plugged into the terminal end of the inline electric meter device.

16. The system of claim 15, wherein the inline electric meter device is configured to check metering accuracy of the EVSE unit.

17. The system of claim 15, wherein the inline electric meter device includes:
a global positioning system (GPS) receiver, and wherein the inline electric meter device is configured to record at least one of a location, a date, or a time associated with one or more measurements;
a camera configured to capture one or more images documenting information about at least one of the EVSE unit or the electric vehicle-emulating electric load;
a report generator logic section configured to generate one or more reports regarding metering accuracy of the EVSE unit; and
one or more antennas that are configured to transmit the one or more reports.

18. The system of claim 15, wherein:
the inline electric meter device is configured to manipulate a pilot signal associated with at least one of the EVSE unit or the electric vehicle-emulating electric load, thereby causing one or more modified conditions of a charging process of the electric vehicle-emulating electric load; and
the inline electric meter device is configured to take one or more measurements under the one or more modified conditions of the charging process.

* * * * *